US012683622B2

(12) United States Patent
Olieman et al.

(10) Patent No.: US 12,683,622 B2
(45) Date of Patent: Jul. 14, 2026

(54) SYSTEM AND METHOD OF NOISE SCALING OF ANALOG TO DIGITAL CONVERSION SAMPLES BASED ON SUBSEQUENT FILTER COEFFICIENTS

(71) Applicant: NXP B.V., Eindhoven (NL)

(72) Inventors: Erik Olieman, Waalre (NL); Alphons Litjes, Zijtaart (NL); Robert van Veldhoven, Valkenswaard (NL)

(73) Assignee: NXP B.V., Eindhoven (NL)

( * ) Notice: Subject to any disclaimer, the term of this patent is extended or adjusted under 35 U.S.C. 154(b) by 320 days.

(21) Appl. No.: 18/106,803

(22) Filed: Feb. 7, 2023

(65) Prior Publication Data

US 2024/0267056 A1 Aug. 8, 2024

(51) Int. Cl.
*H03M 1/10* (2006.01)
*H03M 1/06* (2006.01)
(Continued)

(52) U.S. Cl.
CPC ......... *H03M 1/124* (2013.01); *H03M 1/0626* (2013.01); *H03M 1/08* (2013.01)

(58) Field of Classification Search
CPC ...... H03M 3/452; H03M 3/424; H03M 3/462; H03M 3/344; H03M 3/372; H03M 1/0626; H03M 1/0641; H03M 1/12; H03M 1/504; H03M 3/43; H03M 3/448; H03M 3/458; H03M 3/46; H03M 3/50; H03M 1/002; H03M 1/0604; H03M 1/0629; H03M 1/0836; H03M 1/0863;

H03M 1/1023; H03M 1/1215; H03M 1/1245; H03M 1/181; H03M 1/188; H03M 1/468; H03M 13/41;
(Continued)

(56) References Cited

U.S. PATENT DOCUMENTS 4,833,474 A * 5/1989 Nagai ................... H03M 3/324
708/313
5,619,202 A * 4/1997 Wilson .................. H03M 3/372
341/123
(Continued)

OTHER PUBLICATIONS

Bos, Thomas et al. "An 8-11b 320kS/s Resolution Scalable Noise Shaping SAR ADC." © 2017 IEEE. Downloaded on Apr. 25, 2022 from IEEE Xplore. pp. 209-212.
(Continued)

*Primary Examiner* — Linh V Nguyen

(57) ABSTRACT

A system and method of analog to digital conversion including an adjustable ADC, FIR filter circuitry, and a noise setting controller. The ADC samples an analog input signal to provide digital samples at a sample rate that is Y times an output rate of output digital values. The FIR filter circuitry includes Y taps with Y corresponding coefficients and is configured to filter the digital samples from the ADC and to provide filtered digital samples at the sample rate. decimation circuitry may be included to decimate the filtered digital samples by Y to provide the output digital values. The noise setting controller provides an adjustment value to the ADC to adjust noise contribution of the digital samples provided by the ADC based on corresponding coefficients of the FIR filter circuitry. The ADC is adjusted to reduce noise contribution of digital samples that correspond with higher FIR filter coefficients.

20 Claims, 6 Drawing Sheets

(51) Int. Cl.
   *H03M 1/08* (2006.01)
   *H03M 1/12* (2006.01)

(58) Field of Classification Search
   CPC ...... H03M 13/6331; H03M 3/30; H03M 3/34;
            H03M 3/354; H03M 3/368; H03M 3/37;
            H03M 3/374; H03M 3/376; H03M 3/386;
            H03M 3/388; H03M 3/392; H03M 3/394;
            H03M 3/396; H03M 3/402; H03M 3/404;
            H03M 3/44; H03M 3/454; H03M 3/464;
            H03M 3/468; H03M 3/486; H03M 3/49;
            H03M 3/494; H03M 3/506; H03M 5/08;
                                          H03M 5/12
   USPC ........................... 341/118–120, 61, 143, 155
   See application file for complete search history.

(56)                    References Cited

U.S. PATENT DOCUMENTS

| | | | | | |
|---|---|---|---|---|---|
| 5,646,621 | A | * | 7/1997 | Cabler ................... | H03M 3/344 |
| | | | | | 708/313 |
| 6,067,329 | A | * | 5/2000 | Kato ....................... | H04L 27/06 |
| | | | | | 375/321 |
| 6,208,272 | B1 | * | 3/2001 | Henry ................. | H03M 7/3082 |
| | | | | | 341/51 |
| 6,326,912 | B1 | * | 12/2001 | Fujimori ............... | H03M 3/412 |
| | | | | | 341/172 |
| 6,680,683 | B2 | * | 1/2004 | Nohara ............. | H04L 25/03834 |
| | | | | | 341/155 |
| 6,985,099 | B1 | * | 1/2006 | Luz ........................ | H03M 1/185 |
| | | | | | 341/139 |
| 7,227,479 | B1 | * | 6/2007 | Chen ................... | H03M 1/1004 |
| | | | | | 341/169 |
| 8,659,454 | B2 | * | 2/2014 | Sugimoto ........... | H03M 1/0836 |
| | | | | | 341/120 |
| 9,319,057 | B1 | * | 4/2016 | Pandey ............. | H04L 25/03057 |
| 2008/0218392 | A1 | * | 9/2008 | Van Veldhoven .... | H03M 3/462 |
| | | | | | 455/334 |
| 2009/0207060 | A1 | * | 8/2009 | Hernandez ........... | H03M 3/344 |
| | | | | | 341/143 |
| 2018/0034471 | A1 | | 2/2018 | Verdant et al. | |

OTHER PUBLICATIONS

Lee, Byung-Geun. "Power and Bandwidth Scalable 10-b 30-MS/s
SAR ADC." IEEE Transactions on Very Large Scale Integration
(VLSI) Systems. vol. 23, No. 6, Jun. 2015. Downloaded on Apr. 25,
2022 from IEEE Xplore. pp. 1103-1110.
Wang, B., "A 550-μW 20-kHz BW 100.8-dB SNDR Linear Expo-
nential Multi-Bit Incremental ΣΔ ADC With 256 Clock Cycles in
65-nm CMOS", IEEE Journal of Solid-State Circuits, vol. 54, No.
4, Apr. 2019.

* cited by examiner

N = 7
M = 8
SMV = 6
NMV = 3

| Digital Sample | NMV | Relative Noise Improvement [dB] | Relative Power [Power units, Pu] |
|---|---|---|---|
| DS1 | 1 | 0 | 8 + 4 = 12 |
| DS2 | 1 | 0 | 8 + 4 = 12 |
| DS3 | 3 | +6 | 8 + 4*3 = 20 |
| DS4 | 7 | +12 | 8 + 4*7 = 36 |
| DS5 | 7 | +12 | 8 + 4*7 = 36 |
| DS6 | 3 | +6 | 8 + 4*3 = 20 |
| DS7 | 1 | 0 | 8 + 4 = 12 |
| DS8 | 1 | 0 | 8 + 4 = 12 |

*FIG. 7*

SYSTEM AND METHOD OF NOISE SCALING OF ANALOG TO DIGITAL CONVERSION SAMPLES BASED ON SUBSEQUENT FILTER COEFFICIENTS

BACKGROUND

Field Of The Invention

The present invention relates in general to analog to digital conversion, and more particularly, to a system and method of scaling noise of analog to digital conversion samples based on the coefficient values of a subsequent filter.

Description of the Related Art

The signal-to-noise ratio (SNR) of an analog to digital converter (ADC) can be improved by oversampling followed by a finite impulse response (FIR) filter. In order to achieve improved interferer suppression, different coefficients are selected for the taps of the FIR filter, such as according to a Hamming Window or the like. The tap coefficients of the FIR filter, for example, may be configured to better suppress higher frequency content to remove out-of-band signals and to improve suppression of interferer signals. A FIR filter, however, is less efficient at suppressing uncorrelated random comparison noise such as, for example, thermal noise, than a moving average filter. Although a moving average filter averages out noise equally, it may not sufficiently suppress higher frequency content and interfering signals.

BRIEF DESCRIPTION OF THE DRAWINGS

Embodiments of the present invention are illustrated by way of example and are not limited by the accompanying figures. Similar references in the figures may indicate similar elements. Elements in the figures are illustrated for simplicity and clarity and have not necessarily been drawn to scale.

FIG. 7 is a table illustrating relative noise improvement and corresponding relative power consumption for a corresponding majority vote setting according to one embodiment.

DETAILED DESCRIPTION

Analog to digital conversion configured according to the present disclosure uses a finite impulse response (FIR) filter with non-equal coefficients to maintain a desired interferer suppression, while also using an adjustable analog to digital converter (ADC) that is adjusted based on the FIR filter coefficients to improve noise performance. The improved noise performance achieved may be close to the performance of a moving average filter within a certain power budget. The improved noise performance reduces uncorrelated random comparison noise, such as, for example, thermal noise. Noise performance is improved by oversampling and by dynamically controlling the noise contribution for each individual conversion output sample based on the values of coefficients and corresponding weights of the FIR filter. As used herein, a filter having multiple taps with non-equal coefficients means that those taps with larger coefficients apply greater weight as compared to taps with smaller coefficients that apply lesser weight. The ADC is adjusted to reduce noise contribution of those samples associated with larger coefficients with greater weight.

Figure 1:
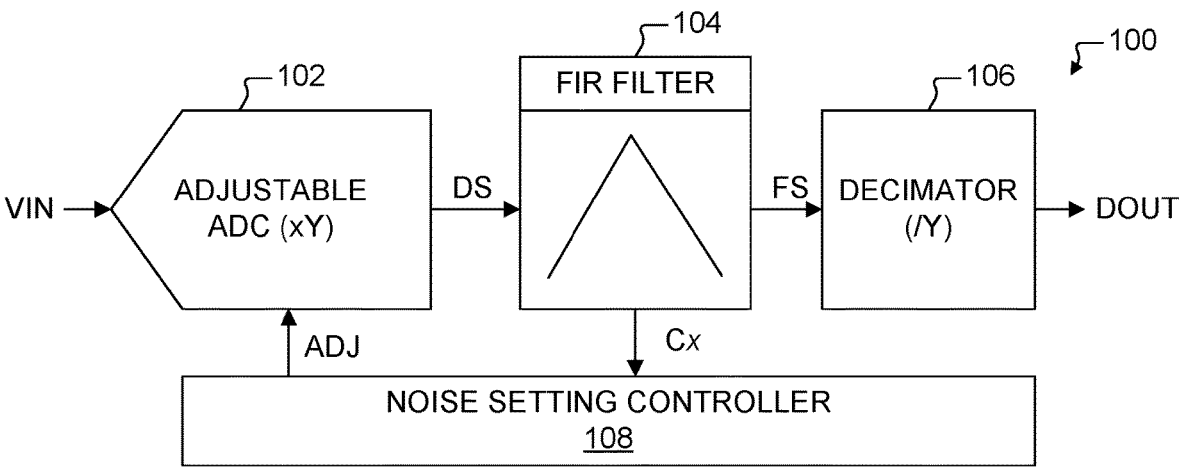
FIG. 1 is a simplified block diagram of an analog to digital conversion system implemented according to one embodiment for converting an analog input signal to a digital output signal.

FIG. 1 is a simplified block diagram of an analog to digital conversion system 100 implemented according to one embodiment for converting an analog input signal VIN to a digital output signal DOUT. The analog to digital conversion system 100 includes an adjustable ADC 102, a FIR filter 104, a decimator 106, and a noise setting controller 108. An analog input signal VIN is provided to an input of the ADC 102 having an output providing digital samples DS to an input of the FIR filter 104. The ADC 102 is configured to oversample VIN by an integer factor of Y times an output rate of digital values provided on DOUT. The analog input signal VIN may be in the form of a voltage although alternative forms are contemplated. The input signal VIN may be a single-ended signal or a differential signal in which the ADC 102 is adjusted accordingly.

The FIR filter 104 filters the digital samples DS and has an output providing filtered samples FS to an input of the decimator 106, which decimates by the factor of Y and which has an output providing digital values on the output signal DOUT. The FIR filter 104 has a series of taps each programmed with a corresponding one of multiple different coefficients or weight values. The noise setting controller 108 accesses these coefficients, shown as Cx, and dynamically adjusts operation of the ADC 102 via adjust signals ADJ. The adjustment of operation of the ADC 102 is based on the FIR filter coefficients in order to reduce the noise contribution of the digital samples DS. In this manner, the contribution of uncorrelated random comparison noise, such as thermal noise, is reduced. The ADC 102 oversamples by the factor of Y (xY), and the decimator 106 decimates the filter samples FS by a reciprocal of the same factor of Y (/Y) to develop the digital values on DOUT. In one embodiment, decimation may function by selecting every Y'th sample of FS to provide the digital values on DOUT.

In one embodiment, the FIR filter coefficients are selected and programmed to suppress interferer signals, such as higher frequency signals or out-of-band signals when the analog to digital conversion system 100 is used within a communication system or the like. The FIR filter coefficients may be configured according to a selected window function, such as a Hann window function or a Hamming window function or the like. The noise contribution in the ADC 102 depends upon the weight given to that sample by the corresponding coefficient programmed in the FIR filter 104. For example, if the weight of a sample in the FIR filter 104 is less than the weight of a prior sample, then it is allowed to have more noise without having a major impact on the overall signal-to-noise ratio (SNR) at the output of the FIR filter 104. In one embodiment, the contribution of uncorrelated random comparison noise (e.g., thermal noise) of a sample may be adjusted by adjusting operation of the ADC 102 when converting that sample as further described herein. By dynamically controlling the noise contribution for each individual sample of the ADC 102 based on the coefficients of the FIR filter 104, the noise performance and thus the overall SNR is improved.

Figure 2:
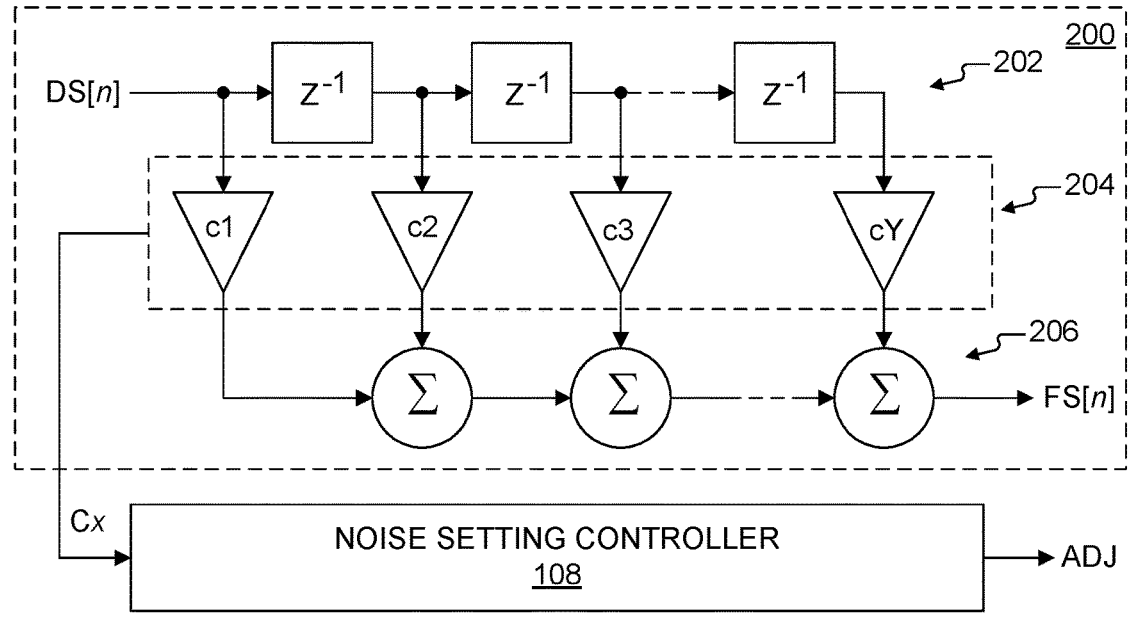
FIG. 2 is a simplified block diagram of a FIR filter interfacing the noise setting controller of FIG. 1 according to one embodiment which may be used as the FIR filter of FIG. 1.

FIG. 2 is a simplified block diagram of a FIR filter 200 interfacing the noise setting controller 108 according to one embodiment, in which the FIR filter 200 may be used as the FIR filter 104. The particular configuration of the FIR filter 200 is just one example of many different types of filter configurations that may be used as the FIR filter 104, in which it is understood that many other and different filter circuitry configurations may be used instead. The FIR filter 200 includes a sequential series of digital delay elements 202, a sequential series of digital amplifier taps 204, and a sequential series of digital summing junctions 206. Each of the digital delay elements 202 is denoted with the z-transform function $Z^{-1}$ indicating a unitary delay, such as one cycle of a sample clock or the like. The series of digital samples DS, shown generally as DS[n] in which "n" denotes successive samples separated by delay clock cycles, are input to a first digital delay element and sequentially propagated through the digital delay elements 202 after each delay cycle. Each of the series of digital amplifier taps 204 are programmed with a corresponding one of Y coefficients, individually shown as Cx in which "x" is an index from 1 to Y, or C=c1, c2, c3, . . . , cY, which are collectively provided to the noise setting controller 108. The noise setting controller 108 uses the Cx coefficients to determine the adjust signals ADJ used to adjust operation of the ADC 102 accordingly. Larger valued coefficients correspond with greater weight and smaller values coefficients correspond with lesser weight.

In operation of the FIR filter 200, each digital sample DS propagated through the digital delay elements 202 in sequential delay cycles is multiplied by a corresponding one of the coefficients c1-cN of a corresponding one of the digital amplifier taps 204. The first pair of factors output by the first pair digital amplifier taps are summed together by the first summing junction, the sum at the output of each summing junction is provided to a first input of a next sequential summing junction, and the factor at the output of each successive digital amplifier is provided to a second input of the corresponding successive summing junctions. The output of the last summing junction provides the series of filter samples FS, shown as FS[n] denoting successive filtered samples separated by the delay clock cycles.

Figure 3:
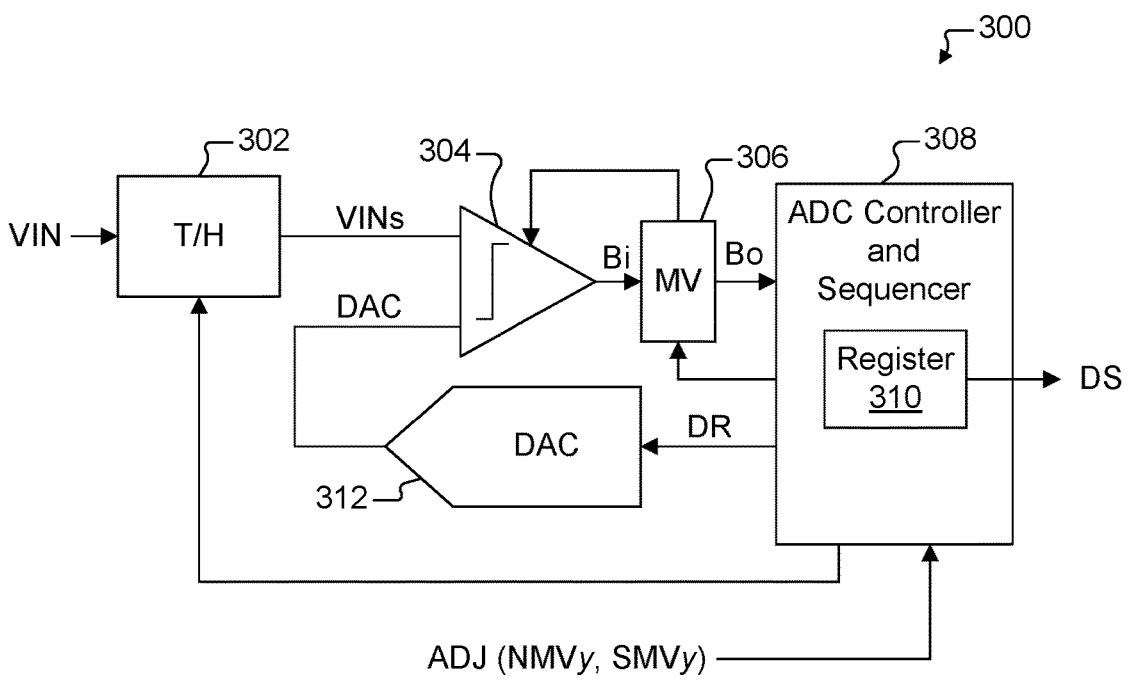
FIG. 3 is a simplified block diagram of an adjustable successive approximation (SAR) ADC with majority voting implemented according to one embodiment, which may be used as the ADC of FIG. 1.

FIG. 3 is a simplified block diagram of an adjustable successive approximation (SAR) ADC 300 with majority voting implemented according to one embodiment, which may be used as the ADC 102. The ADC 300 includes a track and hold (T/H) circuit 302, a comparator 304, a majority vote counter 306, an ADC controller and sequencer 308, an output register 310, and a digital to analog converter (DAC) 312. VIN is provided to an input of the T/H circuit 302, which has an output providing a sampled version of VIN, shown as VINs, to a first input of the comparator 304. The comparator 304 compares VINs with an analog reference value DAC and outputs an input binary value Bi to an input of the majority vote counter 306, which has an output providing an output binary value Bo to an input of the ADC controller and sequencer 308. The register 310, which is provided within or otherwise controlled by the ADC controller and sequencer 308, outputs each digital sample DS once determined. The ADC controller and sequencer 308 outputs a digital reference (DR) value to an input of the DAC 312, which outputs a corresponding analog reference value DAC to a second input of the comparator 304. The DR value has the same number of bits as the DS value, in which both are N bit values.

In operation, the ADC controller and sequencer 308 prompts the T/H circuit 302 to sample VIN, in which the T/H circuit 302 holds an analog sample VINs at the first input of the comparator 304. VINs may be held static while determining each digital sample DS. The ADC controller and sequencer 308 then outputs a series of DR digital values to the DAC 312, which outputs a corresponding series of DAC signals to the second input of the comparator 304. The comparator 304 generates and outputs a corresponding series of binary input values Bi (or "bits") based on the comparison of VINs with each DAC signal. When majority voting is disabled or otherwise bypassed, each Bi value is simply passed (or latched) as a corresponding Bo value provided to the ADC controller and sequencer 308. When majority voting is enabled, multiple Bi values are evaluated and used to determine a final Bo value as described further herein based on majority voting. Each DR value after the first DR value is determined by the ADC controller and sequencer 308 based on the result of the last comparison as reflected by the last Bo value in such a manner as to cause the DAC signal to converge on the VINs signal as further described herein. After a total number of comparisons have been completed, the ADC controller and sequencer 308 stores the final DR value as, or otherwise converts the final DR value to, the final output digital sample DS for the current conversion cycle. Operation is then repeated in sequential cycles to generate a sequential series of digital samples DS.

In one embodiment, the register 310 is an N-bit register in which N is a positive integer, so that each digital sample DS is an N-bit value. It is noted that the adjustable SAR ADC 300 is a single-ended configuration for processing singe-ended input values of VIN using single-ended DAC signals. Although a straightforward binary search algorithm may be used in which N bit comparisons are made to generate N bits for each digital sample DS, the presence of noise may cause a comparison error that is not correctable by subsequent comparisons so that the final value may be incorrect. Instead, sub-radix search algorithms (or non-binary search algorithms with digital correction) may be employed incorporating redundancy in which additional comparisons are used for correcting comparison errors. Such non-binary search algorithms allow early comparison mistakes to be corrected with later comparisons so that the algorithm may still converge on the correct (or at least more accurate) digital value. In such configurations, a decoder or the like within the ADC controller and sequencer 308 (not shown) generates N output bits using an integer number M comparisons in which M is greater than N and also aligns majority voting to those bits that correspond with greater weights in the FIR filter 104. In one embodiment, M=N+1 for one additional comparison per DS value.

In an alternative embodiment, the adjustable SAR ADC 300 may be implemented as a differential configuration for processing differential input values of VIN using differential DAC signals. Differential configurations may employ a binary search algorithm in which N comparisons are used to generate N bit values, or M=N. A differential configuration of the ADC is slightly more complex but allows a reduced number of comparisons for each digital sample DS.

For each analog sample VINs, the ADC controller and sequencer 308 outputs a series of DR values and corresponding DAC signals to converge on VINs for determining the corresponding digital sample DS. In this configuration, the noise setting controller 108 adjusts operation of the ADC 300 by providing ADJ to include a number of majority votes (NMV) value and at least one start majority voting (SMV) value to the ADC controller and sequencer 308, which controls the majority vote counter 306 accordingly. In the general case, ADJ may include up to Y NMV values shown as NMVy, in which Y denotes the oversampling rate (i.e., the number of digital samples DS for generating a digital value output on DOUT), and "y" is an index from 1 to Y. Majority voting is disabled or inactive and thus inapplicable when NMV=1, in which the Bi values are passed through as the Bo values and directly provided to the ADC controller and sequencer 308. For some digital samples DS in which greater noise may be tolerated as further described herein, majority voting is inactivated or bypassed. Also, ADJ may include up to Y SMV values shown as SMVy, although a single SMV value is also contemplated.

When the noise setting controller 108 determines that a particular digital sample is to be generated with reduced noise, it activates majority voting with an SMV value equal to M or less and by setting the corresponding NMV value to an odd integer value greater than 1 (e.g., 3, 5, 7, 9, etc.) for one or more bits beginning with the bit identified by SMV. The SMV value effectively "points" to or otherwise indicates a comparison bit position in which majority voting is applied when determining a digital sample DS. In one embodiment, majority voting may be applied to that bit and the remaining number of comparison bits, although it is understood that majority voting may be programmatically applied to any one or more of the comparison bits. Although SMV may be set equal to 1 so that majority voting applies to every bit comparison, operation of successive approximation means that the initial DAC signals for the most significant bits are sufficiently separated from VINs by an amount greater than a variation of noise so that majority voting is less effective. As the DAC signal converges on VINs such that the two analog signals are sufficiently close, however, the binary value Bi may vary between logic "0" and "1" because of uncorrelated random comparison noise (e.g., thermal noise). In that case, majority voting improves sampling performance by determining which logic value is more likely correct. It is noted that although Y different SMV values may be defined for a given configuration (e.g., shown as SMVy), a single SMV may also be hardcoded or otherwise fixed for optimal performance for a given SAR configuration.

Each NMV value determines the maximum number of successive counts that the Bi output of the comparator 304 is evaluated until a majority binary value is determined as the Bo value. Generally, the greater the NMV value, the more accurate the estimation of the bit value. The effective SNR gain of a comparator with majority voting is about 0.36+0.64 (NMV), so that NMV is the parameter to scale noise up or down. NMV may be updated for every sample as it just modifies the upcoming conversion cycle, so that it allows dynamic noise scaling of the ADC 300.

As a simple example, assume M=N=8, SMV=6, and NMV=9. Since SMV=6 and thus starts at the sixth bit comparison, the most significant bits may be processed normally without majority voting. Majority voting begins at bit 6 and is applied to the remaining least significant 3 bits, including LSB+2, LSB+1, and LSB, with NMV=9. For each of these least significant 3 bits, up to 9 binary values Bi are counted by the majority vote counter 312 at the output of the comparator 308, and the binary value between logic "0" and logic "1" that reaches a count of CEIL(NMV/2) is selected as the binary value for that bit. CEIL is the ceiling function which rounds the parenthetical value up to the nearest integer. Thus, for NMV=9, CEIL(NMV/2)=CEIL(4.5)=5 so that the majority is 5 out of 9. If Bi toggles between logic values for a given set of DAC and VINs values, such as 010101010, then the majority vote counter 308 selects logic "0" as the output binary value Bo for storage into the register 316 for the corresponding bit location since logic "0" occurred 5 out of 9 times and thus was in the majority. Alternatively, for 101010101, the majority vote counter 306 selects logic "1" as the output binary value Bo for storage into the register 316 for the corresponding bit location.

An optimization may be achieved by breaking early when a majority count is achieved before reaching the full number of counts. For example, assuming NMV=9, the count may be terminated early for 11111 (logic "1" determined after only 5 counts), or 00000 (logic "0" determined early), or 101111 (logic "1" determined after only 6 counts), or 010100 (logic "0" determined after only 7 counts), etc. The majority vote counter 312 may be configured to break early to optimize majority voting operation.

Figure 4:
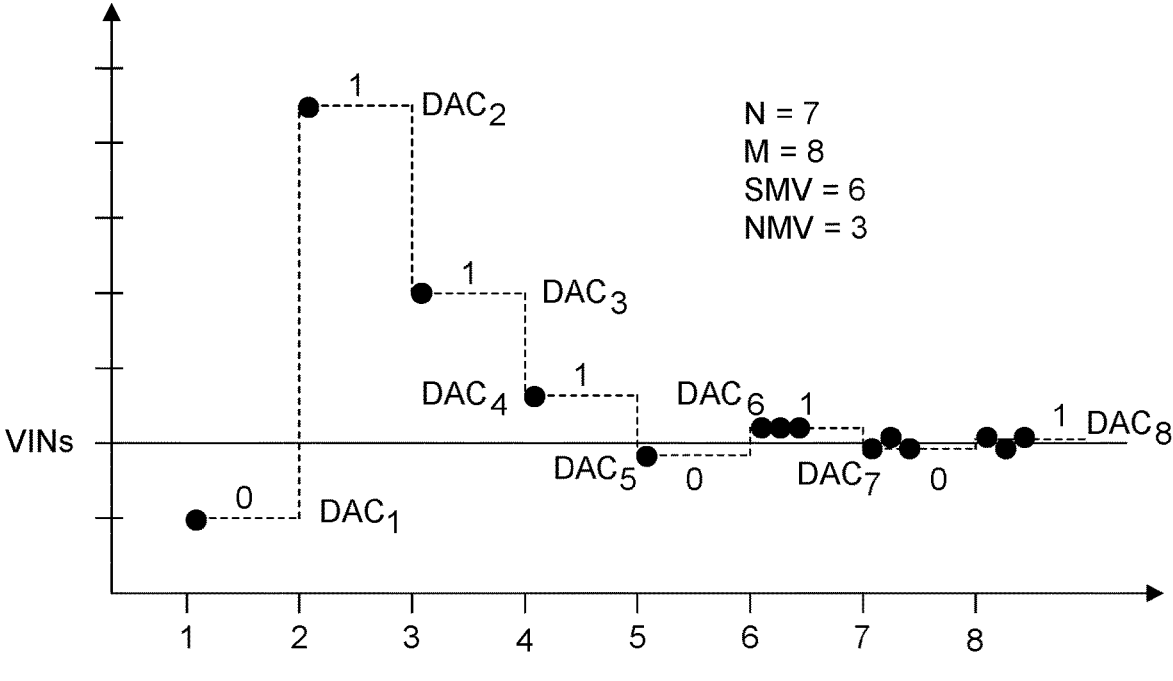
FIG. 4 is a simplified timing diagram illustrating successive approximation operation of the ADC of FIG. 3 configured with majority voting with selected values of N, M, SMV and NMV according to one embodiment.

FIG. 4 is a simplified timing diagram illustrating successive approximation operation of the ADC 300 configured with majority voting for a simplified case in which N=7, M=8, SMV=6 and NMV=3 according to one embodiment. An arbitrary sample VINs is shown plotted together with a series of M DAC reference signals $DAC_m$ in which "m" is an index value from 1 to M, or $DAC_1$, $DAC_2$, . . . , $DAC_8$. The DAC signal is adjusted after each comparison of the comparator 304 to ultimately converge on VINs based on comparisons. Black dots denote the Bi value for each comparison, and adjacent each sequential DAC signal level is the corresponding Bo comparison bit value. In this case for SMV=6, majority counting only applies to the 3 least significant comparison bits, and CEIL(NMV/2)=CEIL(1.5) =2 for majority count. Only M=8 comparisons are shown for simplicity of discussion in which N=7, in which it is understood that one additional comparison is used for redundancy (e.g., M>N).

The ADC controller and sequencer 308 outputs the first DR value for m=1 which is converted to $DAC_1$ by the DAC 312. Since $DAC_1$ is less than VINs, the comparator 308 outputs Bi=0 which is passed as Bo so that Bo=0. The ADC controller and sequencer 308 detects Bo=0 and increases the DR value by a predetermined amount (e.g., a full MSB quantization level) resulting in the next DAC signal $DAC_2$ for m=2. Since $DAC_2$ is greater than VINs, the comparator 308 outputs Bi=1=Bo. The ADC controller and sequencer 308 detects Bo=1 and reduces the DR value by about ½ quantization level (QL) resulting in a next analog output signal $DAC_3$ for m=3. Since $DAC_3$ is still greater than VINs, the comparator 308 outputs Bi=1=Bo. The ADC controller and sequencer 308 detects Bo=1 and reduces the DR value resulting in the next DAC signal $DAC_4$ for m=4. Since $DAC_4$ is still greater than VINs, the comparator 308 outputs Bi=1=Bo. The ADC controller and sequencer 308 detects Bo=1 and reduces the DR value resulting in the next DAC signal $DAC_5$ for m=5. In this case, since $DAC_5$ is less than VINs, the comparator 304 outputs Bi=0=Bo.

At this point, the ADC controller and sequencer 308 detects Bo=0 and increases the DR value resulting in the next DAC signal $DAC_6$ for m=6. In this case, since m=6=SMV for the sixth bit comparison, majority counting by the majority voting counter 306 is activated by the ADC controller and sequencer 308. Since NMV=3, up to 3 counts of Bi are evaluated for determining Bo as illustrated with 3 sequential black dots. Since $DAC_6$ is greater than VINs and since all three Bi value counts are logic "1", the majority vote counter 306 outputs Bo=1. Although 3 counts are shown, an optimization may be achieved by breaking after the first 2 counts of Bi=1. The ADC controller and sequencer 308 detects Bo=1 and decreases the DR value resulting in the next DAC signal $DAC_7$ for m=7. $DAC_7$ is slightly less than VINs and majority counting is activated with NMV=3 in which up to 3 counts of Bi are evaluated. The Bi values are 010 so that the majority vote counter 306 outputs Bo=0. The ADC controller and sequencer 308 detects Bo=0 and increases the DR value resulting in the last DAC signal $DAC_8$ for m=8. $DAC_8$ is very close but slightly greater than VINs and majority counting is activated with NMV=3 so up to 3 counts of Bi are evaluated. The Bi values are 101 so that the majority vote counter 306 outputs Bo=1, and the estimation of the digital value DS is completed. The final DR value is used as or otherwise converted to the corresponding digital sample DS in the register 310.

Figure 5:
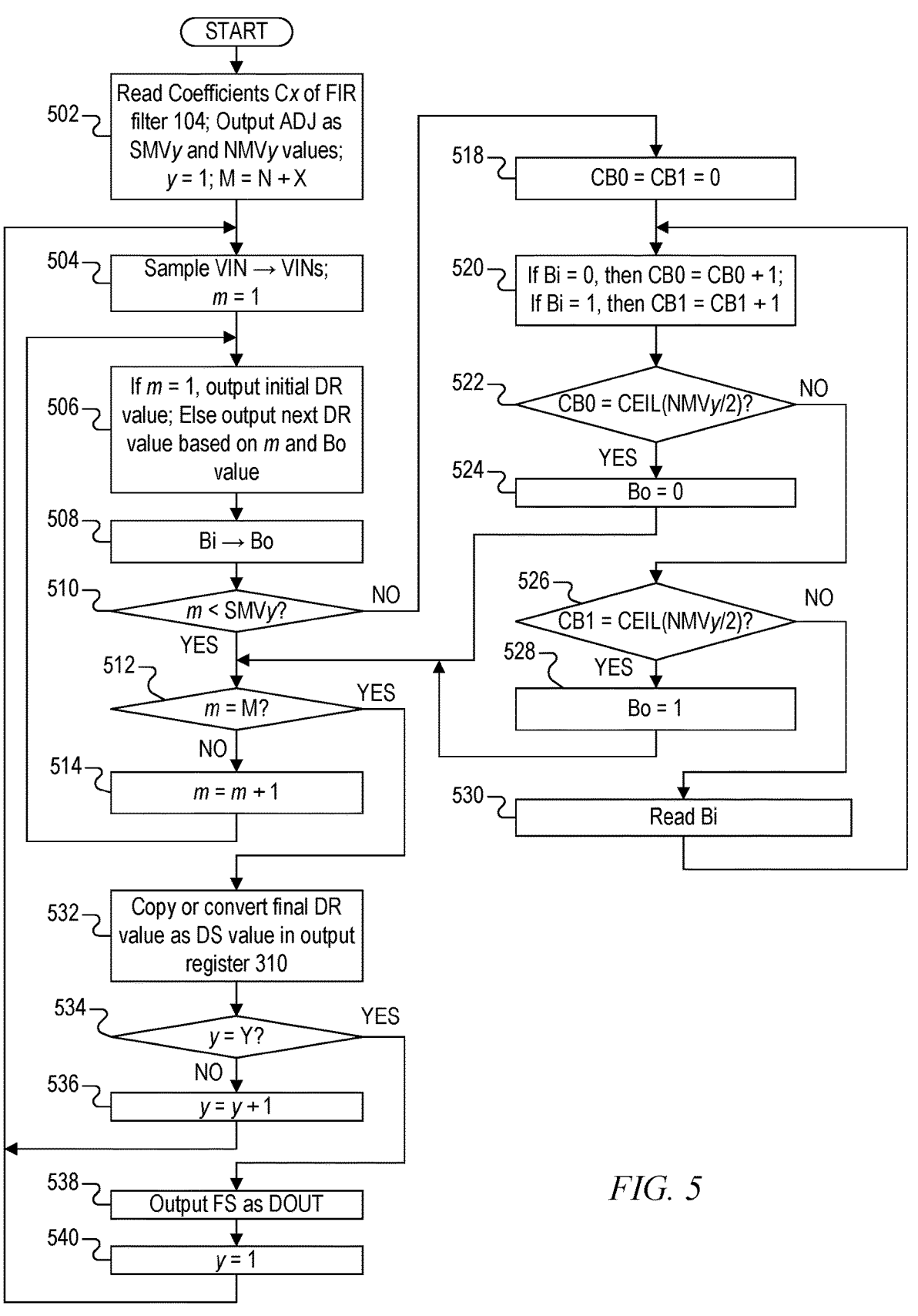
FIG. 5 is a flowchart diagram illustrating operation of the digital conversion system of FIG. 1 using a SAR DAC such as the ADC of FIG. 3 according to one embodiment.

FIG. 5 is a flowchart diagram illustrating operation of the digital conversion system 100 using a SAR DAC such as the ADC 300 according to one embodiment. At a first block 502, the coefficients Cx of the FIR filter 104 are read and the ADJ values are determined accordingly. For a SAR ADC configuration, ADJ is output to the ADC 102 (e.g., ADC 300) as one or more SMV values and one or more NMV values shown as SMVy and NMVy, respectively, as previously described in which "y" denotes an index value from 1 to Y. Y is the oversampling factor of the ADC 102, the number of taps and corresponding coefficients of the FIR filter 104, and also the decimation factor of the decimator 106 as previously described. In this manner, a different SMV value and a different NMV value may be provided for each group of Y digital samples DS.

In one embodiment, a single SMV value may be used and even hardwired (or hardcoded) for a given configuration rather than separate SMV values. An NMV value of 1 effectively disables majority voting for the corresponding digital sample. The index value y is initially set equal to 1 and is incremented from 1 to Y in sequential iterations for each group of Y digital samples. In addition, M, which is the number of bit comparisons, is set equal to N+X in which N denotes the number of bits of each digital sample DS and X is a number of additional comparisons used for non-binary search algorithms incorporating redundancy. X may be 0 for differential configurations using a simple binary search algorithm. In one embodiment for a single-ended configuration, X=1 so that M=N+1 with 1 additional comparison bit.

At next block 504, the input signal VIN is sampled by the T/H circuit 302 which outputs VINs, and the index value m is set equal to 1. The index value m is initially set equal to 1 and is incremented from 1 to M in sequential iterations for each of M comparisons. At next block 506, for the first comparison bit when m=1, an initial DR value is output to the DAC 312 of the ADC 300. In subsequent iterations, the next DR value is based on m (e.g., indicating a magnitude of change of the corresponding DAC signal) and the last determined Bo value for determining the positive or negative direction of change of the DAC signal. At next block 508, the input Bi value output from the comparator 304 as a result of the comparison of the VINs and DAC signals is passed as the output Bo value by the majority vote counter 306. In one embodiment, Bi is simply passed through the majority vote counter 306 as the Bo value. In another embodiment, the majority vote counter 306 latches Bi to provide Bo. At next block 510 it is queried whether m is less than SMVy. As previously described, up to Y separate SMV values may be provided for each group of Y digital samples although only one SMV value may be defined and used for each digital sample.

If m<SMVy so that majority voting is not applicable to the current comparison bit as determined at block 510, then operation advances to block 512 in which it is queried whether m is equal to M which occurs when the total number of comparisons denoted by M has occurred. If m is not yet equal to M, then operation advances to block 514 in which m is incremented by 1, and then operation loops back to block 506 to output the next DR value and corresponding DAC signal as previously described. Thus, each successive DR value and corresponding DAC signal (e.g., $DAC_1$, $DAC_2$, ..., $DAC_M$) is adjusted based on the last comparison with the VINs signal so that DAC eventually converges on VINs. Operation loops between blocks 506 and 516 for each comparison bit until m becomes equal to M as determined at block 512.

Referring back to block 510, when m is equal to or greater than SMVy such that majority voting is applicable for the current comparison bit, then operation branches instead to block 518 in which bit count values CB0 and CB1 are both set equal to 0. CB0 is a count of the number of times Bi is equal to logic "0" and CB1 is a count of the number of times Bi is equal to logic "1" during majority voting by the majority vote counter 308. Operation then advances to block 520 in which CB0 is incremented by one if the current Bi bit is logic "0" or CB1 is incremented by one if the current Bi bit is logic "1". Operation then advances to block 522 to determine whether CB0=CEIL(NMVy/2) which is true when the Bi value has been read as a logic "0" a majority of times during the current majority voting. The value NMVy denotes the NMV value for the current digital sample y. If logic "0" has been determined as the majority value, then operation advances to block 524 in which the Bo value is set equal to 0, and then operation returns back to block 512 for comparing m with M as previously described.

If logic "0" has not yet been determined as the majority value as determined at block 522, then operation branches instead to block 526 to determine whether CB1=CEIL (NMVy/2) which is true when the Bi bit has been read as a logic "1" a majority of times during the current majority voting. If logic "1" has been determined as the majority value, then operation advances to block 528 in which the Bo value is set equal to 1, and then operation returns back to block 512 for comparing m with M.

If neither logic "0" nor logic "1" have been determined as the majority value as determined at blocks 522 and 526, then operation instead branches to block 530 in which the output of the comparator 304 is read (or latched) as the next Bi value. Then operation loops back to block 520 in which either CB0 or CB1 is incremented based on the next value of Bi. Operation loops between blocks 520 and 530 until Bo is determined to be logic "0" or logic "1" based on majority voting. It is noted that regardless of the value of SMVy, when NMVy=1, majority voting is effectively disabled since Bo is simply set equal to the value of bit Bi.

Referring back to block 512, when m=M such that all M bit comparisons have been made for the current digital sample, then operation instead branches to block 532 in which the final DR value is copied or converted as the DS value provided in the output register 310 and thus output as the next digital sample DS. The ADC 102 outputs the digital sample DS as the next successive digital sample DS[n] provided to the FIR filter 104. Operation then advances to block 534 in which it is queried whether the count value y is equal to Y. If not, operation advances to block 536 in which y is incremented by 1, and then operation loops back to block 504 to re-sample VIN as the next sampled value VINs and to set m back to 1 for performing another M comparisons to determine the next digital sample DS. Operation loops back to block 504 from block 536 until y reaches Y as determined at block 534. When y=Y, then operation branches instead to block 538 in which the current filtered sample FS is output from the decimator 106 on DOUT as shown in FIG. 1. Operation then advances to block 540 in which the index y is set back to 1, and then operation loops back to block 504 to take the next sample of VIN and to set m back to 1.

The flowchart of FIG. 5 reflects operation of binary searching that may be performed by a SAR ADC having a single-ended configuration in which a sub-radix search algorithm or the like is employed that incorporates redundancy in which additional comparisons are used for correcting comparison errors. The flowchart of FIG. 5 may be modified for an alternative embodiment in which the SAR ADC is implemented as a differential configuration in which a simple binary search may be used. Operation is similar and the function of configuring operation of the ADC based on subsequent filter coefficients remains applicable. Although not shown, operation may loop back to block 502 if and when the coefficients of the FIR filter 104 are changed.

Figure 6:
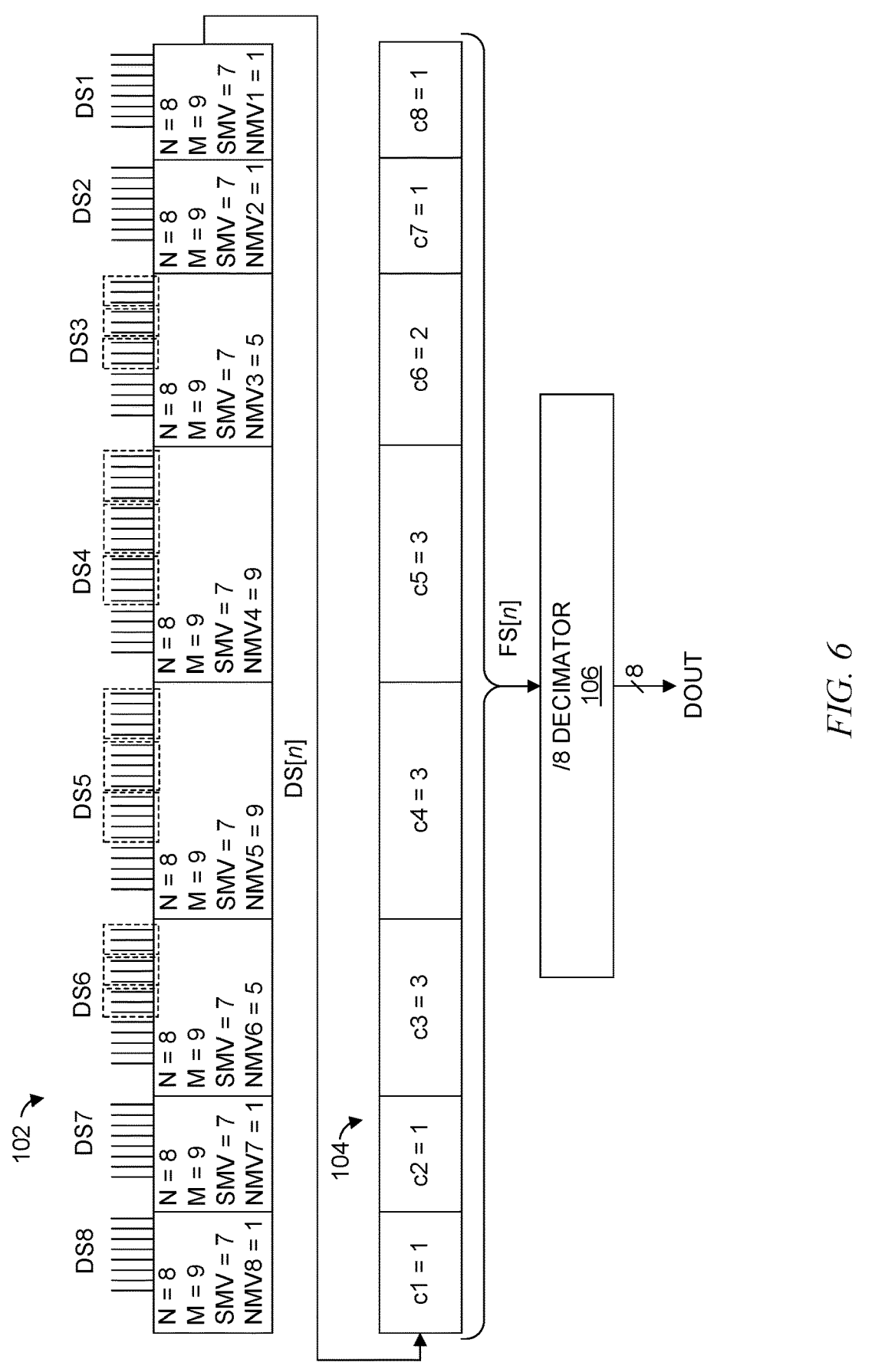
FIG. 6 is a figurative graphic diagram symbolically illustrating operation of the analog to digital conversion system of FIG. 1 according to one embodiment for a selected number of bits and oversampling.

FIG. 6 is a figurative graphic diagram symbolically illustrating operation of the analog to digital conversion system 100 according to one embodiment in which N=8, M=N+1=9, SMV=7 (for all bit comparisons) and Y=8. The group of 8 digital samples DS1, DS2, . . . , DS8 output from the ADC 102, shown from right to left, are developed from bit values shown as vertical lines above sequential boxes. Each box lists the number of bits N=8, the number of bit comparisons M=9, the SMV value, and the corresponding NMVy value for each of the digital samples, shown as NMV1, NMV2, . . . , NMV8. When NMV>1 for majority counting, multiple bit values are shown within dashed line boxes to illustrate that multiple bit counts are made until a majority value is determined for that bit of DS. For the first two digital samples DS1 and DS2 as well as the last two digital samples DS7 and DS8, NMV=1 so that majority voting is inactive or disabled. For the 3rd digital sample DS3 and the 6th digital sample DS6, NMV=5 so that the $7^{th}$, $8^{th}$, and $9^{th}$ comparison bits are subject to majority voting in which the logic value reaching 3 counts out of a total of 5 counts is determined as the bit value. For the $4^{th}$ and 5th digital samples DS4 and DS5, SMV=6 and NMV=9 so that the $7^{th}$, $8^{th}$, and $9^{th}$ comparison bits are subject to majority voting in which the logic value reaching 5 counts out of a total of 9 counts is determined as the bit value.

Each of the digital samples DS1-DS8 are serially fed as DS[n] into the input of the FIR filter 104 having 8 taps with corresponding coefficients c1=1, c2=1, c3=2, c4=4, c5=4, c6=2, c7=1, and c8=1. It is noted that the 8 digital samples DS1-DS8 are shown vertically aligned with corresponding taps of the FIR filter 104 after 8 shifts. As shown, after 8 shifts from left to right into the FIR filter 104, the first digital sample DS1 is aligned with the last tap (or the $8^{th}$ tap) with coefficient c8=1 having the lowest weight value, the second digital sample DS1 is aligned with the 7th tap with coefficient c7=1 also having the lowest weight value, the third digital sample DS3 is aligned with the 6th tap with coefficient c6=2 having a middle weight value, the fourth digital sample DS4 is aligned with the $5^{th}$ tap with coefficient c5=4 having the highest weight value, the 5th digital sample DS5 is aligned with the $4^{th}$ tap with coefficient c4=4 also having the highest weight value, the $6^{th}$ digital sample DS6 is aligned with the $3^{rd}$ tap with coefficient c3=2 having a middle weight value, the $7^{th}$ digital sample DS7 is aligned with the $2^{nd}$ tap with coefficient c2=1 having the lowest weight value, and the $8^{th}$ and last digital sample DS8 is aligned with the $1^{st}$ tap with coefficient c1=1 also having the lowest weight value.

In this manner, the first two and the last two digital samples DS1, DS2, DS7, and DS8 are aligned and associated with FIR taps having the lowest weight coefficient with the lowest weight, so that a greater amount of uncorrelated random comparison noise (e.g., thermal noise) may be tolerated. Thus, majority voting for these digital samples is not applied. The third and sixth digital samples DS3 and DS6 are aligned and associated with FIR taps having medium weighted coefficients for reduced noise tolerance, in which majority voting is applied with NMV=5. The middle digital samples DS4 and DS5 are aligned and associated with FIR taps having the highest weight coefficients for the least noise tolerance, in which majority voting is applied with NMV=9. Actual coefficients and corresponding majority voting parameters may be adjusted to provide an optimal trade-off between noise reduction and power consumption.

In general, the noise setting controller 108 reads the coefficient values Cx of the FIR filter 104 and applies a higher level of majority voting to corresponding digital samples to reduce the noise contribution for those samples associated with the highest weight coefficients. The filtered samples FS[n] are serially shifted into the decimator 106, which decimates by Y=8 by selecting every $8^{th}$ filtered sample as the digital value output on DOUT. It is noted that after 8 shifts so that the digital samples are aligned with the corresponding FIR taps as shown, the decimator 106 selects that filtered sample as the output. The process repeats after each of successive 8 shifts for decimation.

FIG. 7 is a table illustrating relative noise improvement in decibels (dB) and corresponding relative power consumption (in relative power units, Pu) for a corresponding NMV value (e.g., majority vote setting) according to one embodiment. Eight digital samples are shown DS1-DS8 with corresponding majority vote settings of 1, 1, 3, 7, 7, 2, 1, 1. There is no noise improvement without majority voting for samples DS1, DS2, DS7, and DS8 so that the noise improvement is shown as 0 db with corresponding power consumption of 12 Pu's each. DS3 and DS6 with majority vote setting of 3 each achieves a noise improvement of 6 dBs with a corresponding increase in power from 12 to 20 Pu's each. DS4 and DS5 with majority vote setting of 7 each achieves a noise improvement of 12 dBs with a corresponding increase in power from 12 to 36 Pu's each. The table illustrates that majority voting provides a significant improvement in noise with a corresponding tradeoff of increased power consumption. It is appreciated that the vote setting may be adjusted for a given configuration to achieve a desired noise improvement within an available power budget.

11                                                                  12

Figure 8:
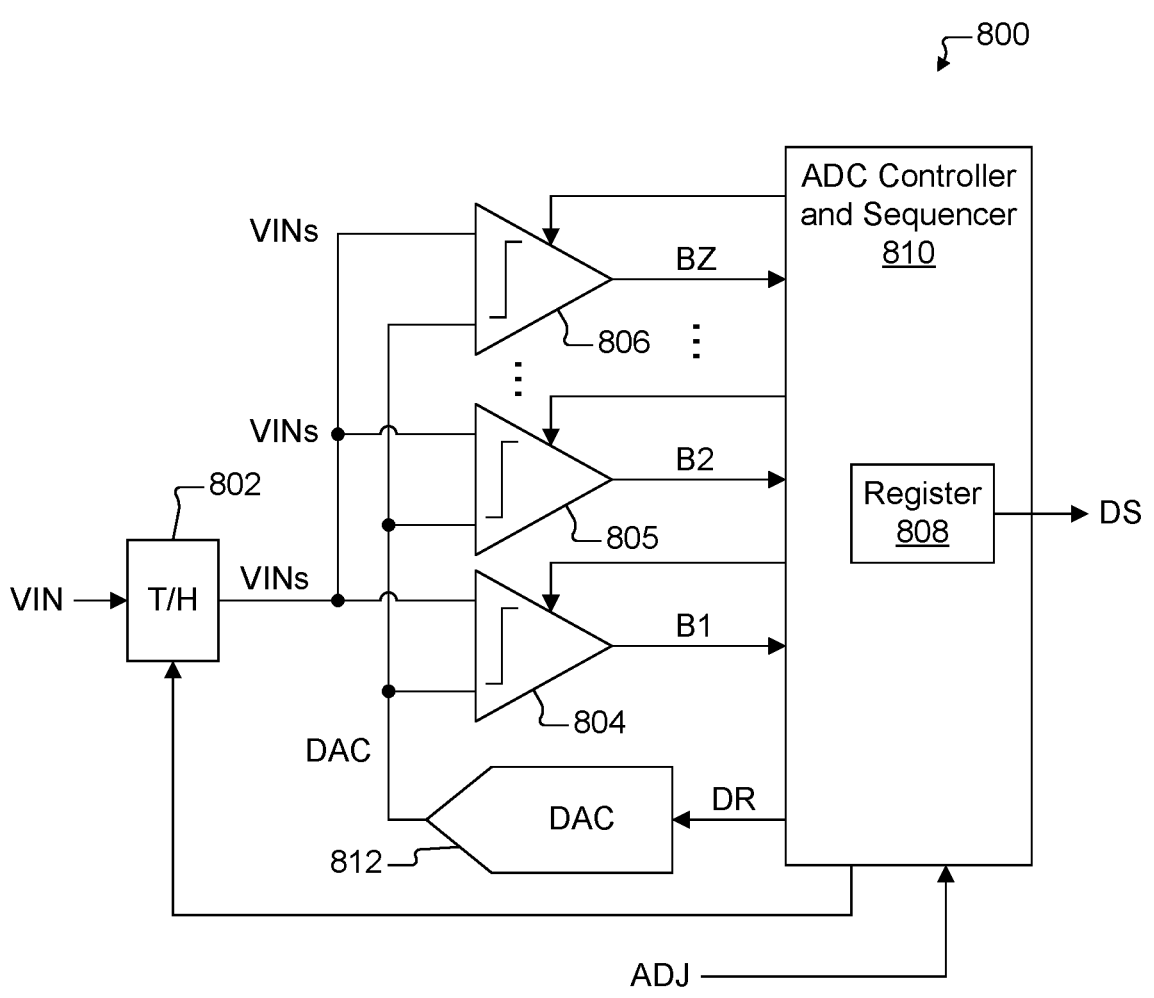
FIG. 8 is a simplified block diagram of an adjustable SAR ADC with multiple comparators implemented according to one embodiment which may be used as the ADC of FIG. 1.

FIG. 8 is a simplified block diagram of an adjustable SAR ADC 800 with a multiple number Z of comparators implemented according to one embodiment, which may be used as the ADC 102. The ADC 800 also includes a track and hold (T/H) circuit 802 having an input receiving VIN and an output providing VINs, a first comparator 804, a second comparator 805 and so on up to a $Z^{th}$ comparator 806, each having a first input receiving VINs and a second input receiving a DAC signal, an ADC controller and sequencer 810 including an output register 808, and a digital to analog converter (DAC) 812 providing the DAC signal. The ADC controller and sequencer 810 prompts the T/H circuit 802 to sample VIN and hold a sample VINs static for each digital sample generated and provided on DS in a similar manner previously described for the ADC 300. Although 3 comparators 804, 805, and 806 are shown, it is understood that 2 or more comparators may be included in which Z may be less than 3 (e.g., 2) or may be greater than 3.

Each digital sample DS includes N bits and the register 808 is an N-bit register including a sequence of N bits from MSB to LSB for each digital sample DS. For each analog sample VINs, the ADC controller and sequencer 810 outputs a series of digital reference (DR) values to an input of the DAC 812, which outputs a corresponding series of DAC analog reference signals to a second input of each of the comparators 804-806. When enabled, the comparator 804 compares VINs with the DAC signal being provided and outputs a corresponding bit or binary value B1 indicative of the comparison. Similarly, when enabled, the comparator 805 compares VINs with the DAC signal being provided and outputs a corresponding bit or binary value B2 indicative of the comparison. The same is true for each of the Z comparators, in which the last comparator 806 outputs a corresponding bit or binary value BZ indicative of the comparison. Both binary and nonbinary with redundancy configurations are contemplated. Based on the results of the comparisons, the ADC controller and sequencer 810 stores the corresponding digital sample into the register 808 based on the final DR value.

In this configuration, the noise setting controller 108 configures the ADC 800 by providing ADJ to select one of the comparators 804-806 for each comparison. Each of the comparators 804-806 operates at a different noise level and at a different power level. Relatively speaking, the comparator 804 is a comparator with the highest noise that operates at a lowest power level, the comparator 804 is a comparator with a higher noise that operates at a lower power level, and so on up to the last comparator 806, which is a comparator with the lowest noise that operates at a highest power level. In the simplest configuration, only two comparators are used, although any number of comparators may be included. For some digital samples DS in which greater noise may be tolerated, the comparator 804 or the comparator 805 may be selected for each bit. When it is desired to reduce the noise of a digital sample DS, then the comparator 805 or any other comparator up to the last comparator 806 may be selected for one or more bits.

In other embodiments, the comparison bits selected for lower noise may be similar to that shown and described for majority voting. In one embodiment, ADJ may identify a bit location to switch to a different comparator, similar to the SMV value, in which the comparator 804 is used for the MSBs up to identified bit, and then lower noise comparators may be selected for the remaining LSB's. In an alternative embodiment, ADJ identifies which of the comparators 804-806 is to be used for each bit. The SAR ADC 800 may alternatively be configured according to a Data Driven Noise Reduction (DDNR) configuration.

The ADC 300 and the ADC 800 are only two of many different types of configurations that may be used to implement the adjustable ADC 102 to achieve a power versus noise tradeoff. In other configurations (not shown) for example, the ADC 102 may be configured to increase current for those samples in which it is desired to reduce noise or to reduce current for those samples in which a greater amount of noise may be tolerated.

Although the present invention has been described in connection with several embodiments, the invention is not intended to be limited to the specific forms set forth herein. On the contrary, it is intended to cover such alternatives, modifications, and equivalents as can be reasonably included within the scope of the invention as defined by the appended claims. For example, variations of positive circuitry or negative circuitry may be used in various embodiments in which the present invention is not limited to specific circuitry polarities, device types or voltage or error levels or the like. For example, circuitry states, such as circuitry low and circuitry high may be reversed depending upon whether the pin or signal is implemented in positive or negative circuitry or the like. In some cases, the circuitry state may be programmable in which the circuitry state may be reversed for a given circuitry function.

The terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements.

The invention claimed is:

1. An analog to digital conversion system, comprising:
an adjustable analog to digital converter (ADC) that is configured to sample an analog input signal to provide digital samples at a sample rate that is Y times an output rate of output digital values;
finite impulse response (FIR) filter circuitry with Y taps with Y corresponding coefficients that is configured to filter the digital samples from the ADC and to provide filtered digital samples at the sample rate; and
a noise setting controller that configured to provide an adjustment value to the ADC to adjust noise contribution of the digital samples provided by the ADC based on corresponding coefficients of the FIR filter circuitry.

2. The analog to digital conversion system of claim 1, wherein the noise setting controller is configured to provide the adjust value to adjust the ADC to reduce noise for those digital samples that correspond with higher weight coefficients of the FIR filter circuitry.

3. The analog to digital conversion system of claim 1, wherein the noise setting controller is configured to provide the adjust value to adjust the ADC to reduce noise for those digital samples that correspond with higher weight coefficients of the FIR filter circuitry and to increase noise for those digital samples that correspond with lower weight coefficients of the FIR filter circuitry.

4. The analog to digital conversion system of claim 1, wherein the ADC is configured as a successive approximation ADC with majority voting and wherein the noise setting controller provides the adjustment value comprising at least one start majority voting value and at least one majority vote value to control an amount of majority voting applied to each of the digital samples.

5. The analog to digital conversion system of claim 4, wherein the successive approximation ADC performs M comparisons for each of the digital samples, wherein the at least one start majority voting value identifies a comparison bit number to start majority voting for a given digital sample, and wherein a corresponding one of the at least one majority vote value identifies a maximum number of times to count a comparison bit determined for the given digital sample.

6. The analog to digital conversion system of claim 1, wherein the ADC comprises:

a sequencer that is configured to output a digital reference value and to adjust the digital reference value based on an output comparison bit according to successive approximation for M comparisons for each of the digital samples;

a digital to analog converter having an input receiving the digital reference value and an output providing a corresponding analog reference value;

a comparator having a first input receiving a sampled analog input signal, a second input receiving the analog reference value and an output providing an input comparison bit; and a majority vote counter that is configured to determine the output comparison bit as the input comparison bit when majority voting is not applicable and to determine the output comparison bit based on a majority count of the input comparison bit up to a majority vote number when majority voting is applicable.

7. The analog to digital conversion system of claim 6, wherein the noise setting controller is configured to provide the adjustment value comprising at least one start majority voting number for determining when to start majority vote counting and comprising up to Y majority vote numbers for each group of Y digital samples based on values of corresponding coefficients of the FIR filter circuitry.

8. The analog to digital conversion system of claim 1, wherein the ADC comprises a plurality of comparators each having a different noise level and wherein the noise setting controller is configured to provide the adjustment value to select from among the plurality of comparators based on values of corresponding coefficients of the FIR filter circuitry.

9. The analog to digital conversion system of claim 8, wherein the noise setting controller is configured to provide the configuration value to select a lower noise comparator for a digital sample corresponding to a higher FIR filter coefficient with greater weight.

10. The analog to digital conversion system of claim 8, wherein the ADC is configured as a successive approximation ADC performing a plurality of comparisons for each of the digital values and wherein the noise setting controller is configured to provide the configuration value to select at least one lower noise comparator for at least one lower significant comparison bit for a digital sample corresponding to a higher FIR filter coefficient with greater weight.

11. A method of performing analog to digital conversion, comprising:

sampling an analog input signal and providing digital samples at a sample rate that is Y times an output rate of output digital values;

filtering the digital samples by finite impulse response (FIR) filter circuitry with Y taps with Y corresponding coefficients to provide filtered digital samples at the sample rate; and adjusting the sampling to adjust noise contribution of the digital samples based on corresponding coefficients of the FIR filter circuitry.

12. The method of claim 11, wherein the adjusting comprises adjusting the sampling to reduce noise for those digital samples that correspond with higher weight coefficients of the FIR filter circuitry.

13. The method of claim 11, wherein the adjusting comprises adjusting the sampling to reduce noise for those digital samples that correspond with higher weight coefficients of the FIR filter circuitry and to increase noise for those digital samples that correspond with lower weight coefficients of the FIR filter circuitry.

14. The method of claim 11, wherein the sampling comprises performing successive approximation with majority voting and wherein the adjusting comprises performing majority voting using at least one start majority voting value and at least one majority vote value to control an amount of majority voting applied to each of the digital samples.

15. The method of claim 14, wherein the performing successive approximation with majority voting comprises performing M comparisons for each of the digital samples, and wherein the adjusting comprises selecting a comparison bit number to start majority voting for a given digital sample and providing a maximum number of times to count a comparison bit determined for the given digital sample.

16. The method of claim 11, wherein the sampling comprises:

providing a digital reference value and adjusting the digital reference value based on an output comparison bit according to successive approximation for M comparisons for each of the digital samples;

converting each digital reference value into a corresponding analog reference value;

comparing a sampled analog input signal with each analog reference value and providing an input comparison bit; and determining the output comparison bit as the input comparison bit when majority voting is not applicable and determining the output comparison bit based on a majority count of the input comparison bit up to a majority vote number when majority voting is applicable.

17. The method of claim 16, further comprising providing at least one start majority voting number for determining when to start majority vote counting and providing up to Y majority vote numbers for each group of Y digital samples based on values of corresponding coefficients of the FIR filter circuitry.

18. The method of claim 11, wherein adjusting comprises selecting from among a plurality of comparators with different noise levels based on values of corresponding coefficients of the FIR filter circuitry.

19. The method of claim 18, wherein the selecting comprises selecting a lower noise comparator for a digital sample corresponding to a higher FIR filter coefficient with greater weight.

20. The method of claim 18, wherein the sampling comprises performing a plurality of comparisons for each of the digital values and wherein the adjusting comprises selecting at least one lower noise comparator for at least one lower significant comparison bit for a digital sample corresponding to a higher FIR filter coefficient with greater weight.

\* \* \* \* \*